United States Patent [19]

Sugano

[11] Patent Number: 5,283,206
[45] Date of Patent: Feb. 1, 1994

[54] METHOD OF REMOVING GERMANIUM PARTICLES PRECIPITATED IN AN ALUMINUM/GERMANIUM ALLOY FILM

[75] Inventor: Yukiyasu Sugano, Kanagawa, Japan

[73] Assignee: Sony Corporation, Tokyo, Japan

[21] Appl. No.: 894,294

[22] Filed: Jun. 4, 1992

[30] Foreign Application Priority Data

Jun. 7, 1991 [JP] Japan ................... 3-163878

[51] Int. Cl.$^5$ .......................... H01L 21/283
[52] U.S. Cl. ...................... 437/194; 437/197; 437/192; 748/DIG. 58
[58] Field of Search .......... 437/194, 197, 198, 199, 437/192; 257/765, 766, 771; 148/DIG. 58

[56] References Cited

U.S. PATENT DOCUMENTS 3,222,630 12/1965 Gorman ........................ 437/197
4,908,685 3/1990 Shibasaki et al. ............... 257/766
4,965,656 10/1990 Koubuchi et al. ............... 437/190

Primary Examiner—T. N. Quach
Attorney, Agent, or Firm—Hill, Steadman & Simpson

[57] ABSTRACT

A method of removing Ge particles precipitated in an Al/Ge alloy film formed over the surface of a substrate in fabricating a semiconductor device forms a Cu film over the surface of the Al/Ge alloy film in a laminate structure, subjects the laminate structure to heat treatment to make the Ge particles migrate toward the Cu film and to make the Ge particles and the Cu film interact to produce a Ge/Cu compound layer. Thus, the Ge particles precipitated in the Al/Ge alloy film are removed from the Al/Ge alloy film and, consequently, the contact resistance of the Al/Ge alloy film is reduced and the migration resistance of the Al/Ge alloy film is enhanced.

6 Claims, 2 Drawing Sheets

METHOD OF REMOVING GERMANIUM PARTICLES PRECIPITATED IN AN ALUMINUM/GERMANIUM ALLOY FILM

BACKGROUND OF THE INVENTION

1. Field of the Invention

The present invention relates to a method of fabricating a semiconductor device having an aluminum/germanium alloy film (Al/Ge alloy film) forming a wiring layer in the semiconductor device and, more particularly, to a method of removing germanium (Ge) particles precipitated in an Al/Ge alloy film in fabricating a semiconductor device.

2. Description of the Prior Art

Miniaturization of a semiconductor integrated circuit requires a wiring conductive film to be formed flat on a layer insulating film and to perfectly fill up contact holes formed in the layer of insulating film. It is important that the wiring conductive film is formed at a relatively low temperature.

A method of forming such a wiring conductive film employs a sputtering process in which a substrate is heated at a relatively low temperature on the order of 300° C. and which deposits an aluminum/germanium alloy (Al/Ge alloy) of a Ge concentration on the order of 5%. During the sputtering process, particles of the Al/Ge alloy deposited on the layer of insulating film melt and the molten Al/Ge alloy flows and fills up the contact holes formed in the layer of insulating film, and the surface tension makes the molten Al/Ge alloy form an Al/Ge alloy film having a flat surface. Since the Al/Ge alloy film is formed at a relatively low film forming temperature, aluminum (Al) does not permeate the substrate during the Al/Ge alloy film forming process and hence junction breakdown does not occur. Accordingly, any barrier metal film, such as a titanium film or a titanium nitride film, need not be formed before forming the Al/Ge alloy film.

In forming the Al/Ge alloy film by the foregoing method, surplus Ge precipitates in the Al/Ge alloy film because the solid solubility of Ge in an Al/Ge alloy is as small as 1.5%. The particle size of the precipitated Ge particles is on the order of 1 $\mu$m at a maximum, which causes the following problems in submicron processes.

Submicron contact holes are clogged with the precipitated Ge particles of a particle size on the order of 1 $\mu$m, thereby increasing the resistance of the contacts and, in the worst case, no contact is formed in the contact holes. The current flow passage area of the wiring lines of a width less than 1 $\mu$m is reduced by Ge particles (nonconducting particles) having a particle size nearly equal to the width of the wiring lines to deteriorate migration resistance. Ge particles precipitated during the formation of an Al/Ge alloy film cause problems in patterning the Al/Ge alloy film in a wiring pattern. Although it is possible to reduce the Ge concentration to 1.5%, the reduction of the Ge concentration is unable to solve fundamental problems because Ge particles precipitate while the temperature of the Al/Ge alloy film drops from the film forming temperature of 300° C.

SUMMARY OF THE INVENTION

Accordingly, it is an object of the present invention to provide a method of removing precipitated Ge particles from an Al/Ge alloy film to obtain an Al/Ge alloy film capable of forming contacts having low contact resistance in contact holes and having excellent electromigration resistance.

BRIEF DESCRIPTION OF THE DRAWINGS

The above and other objects, features and advantages of the present invention will become more apparent from the following description taken in connection with the accompanying drawings, in which.

DETAILED DESCRIPTION OF THE PREFERRED EMBODIMENTS

A Ge particle removing method in accordance with the present invention applied to a semiconductor device fabricating process comprises a first step of forming a metal film capable of forming a compound together with Ge over the surface of an Al/Ge alloy film formed over the surface of a substrate, and a second step of subjecting the substrate carrying the Al/Ge alloy film and the metal film to a heat treatment for producing a compound of Ge contained in the Al/Ge alloy film and the metal forming the metal film, on the Al/Ge alloy film to remove Ge particles precipitated in the Al/Ge alloy film. Thus, most Ge particles precipitated in the Al/Ge alloy film can be removed from the Al/Ge alloy film.

The Ge particle removing method in the first embodiment according to the present invention as applied to a semiconductor device fabricating process will be described hereinafter.

Figure 1A:
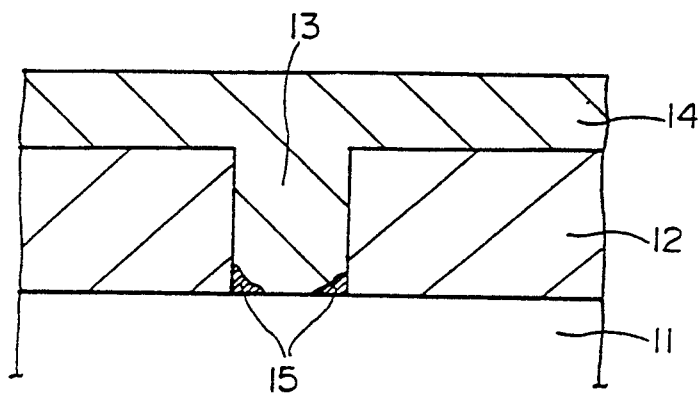
FIGS. 1-A and 1-B are cross-sectional views of a work in different steps of a semiconductor device fabricating process.
Figure 1B:
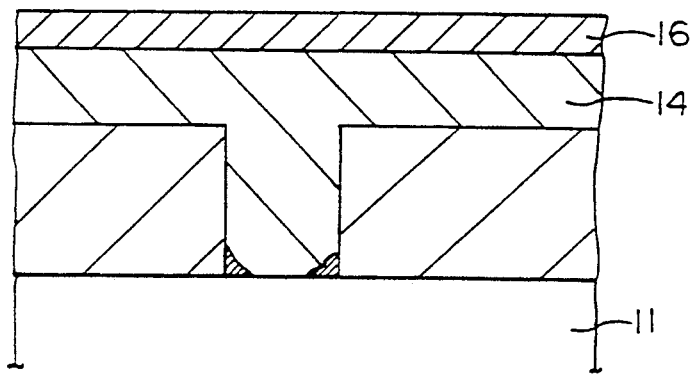

Referring to FIG. 1-A, a BPSG film 12, i.e., a layer of insulating film or material is formed over the upper surface of a silicon substrate 11, and then contact holes 13 are formed in the BPSG film 12 by a photolithographic etching process. Then, the BPSG film 12 is subjected to heat treatment to taper the contact holes 13. Then, an Al/Ge alloy film 14 of 5% Ge concentration is formed over the surface of the BPSG film 12 by a sputtering process, in which the work, i.e., the substrate 11 carrying the BPSG film 12 is, heated at 300° C. Since the Ge concentration of the Al/Ge alloy film 14 is greater than the upper limit of the solid solubility of Ge at the sputtering temperature, i.e., the temperature of 300° C. of the silicon substrate 11, Ge particles 15 precipitate in the contact holes 13.

Figure 2:
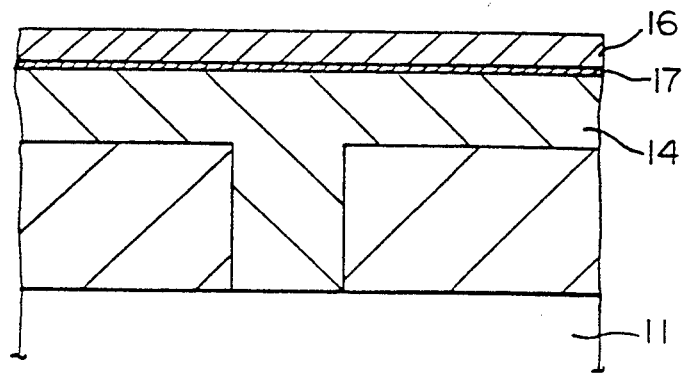
FIG. 2 is a cross-sectional view of the work shown in FIGS. 1-A and 1-B in a Ge particle removing process of a Ge particle removing method in a first embodiment according to the present invention.

Then, in a first step of the Ge particle removing method, a film 16 of a metal capable of producing a compound together with Ge is formed over the surface of the Al/Ge alloy film 14 by a sputtering process or an evaporation process as shown in FIG. 1-B. In this embodiment, the film 16 is a copper (Cu) film 16 of about 100 nm in thickness. In the second step of the Ge particle removing method, the work is subjected to heat treatment, in which the Al/Ge alloy film 14 and the Cu film 16 are heated under heating conditions which may not cause Al to permeate the silicon substrate 11, for example, 300° C.×30 min. Consequently, the Ge particles 15 precipitated in the Al/Ge alloy film 14 melt and migrate through the Al/Ge alloy film 14 toward the Cu film 16. At the same time, Ge forming a solid solution together with Al in the Al/Ge alloy film 14 migrates toward the Cu film 16. Then, a chemical reaction of the molten Ge and the Cu film 16 takes place to produce a Ge/Cu compound layer 17 in the lower surface of the Cu film 16 as shown in FIG. 2. Consequently, only a trace of Ge remains in the Al/Ge alloy film 14. If all the Ge of the Al/Ge alloy film 14 combines with the Cu film 16, the Al/Ge alloy film 14 changes into an aluminum film. The work is immersed in a concentrated nitric acid solution to remove the Cu film 16 and the Ge/Cu compound layer 17.

A Ge particle removing method in a second embodiment according to the present invention will be described with reference to FIGS. 3-A, 3-B and 4, in which parts like or corresponding to those shown in FIGS. 1-A, 1-B and 2 are denoted by the sam reference characters and the description thereof will be omitted.

The Ge particle removing method in the second movement does not remove a film of a compound produced by the interaction of Ge and Cu (or other metal).

Figure 3A:
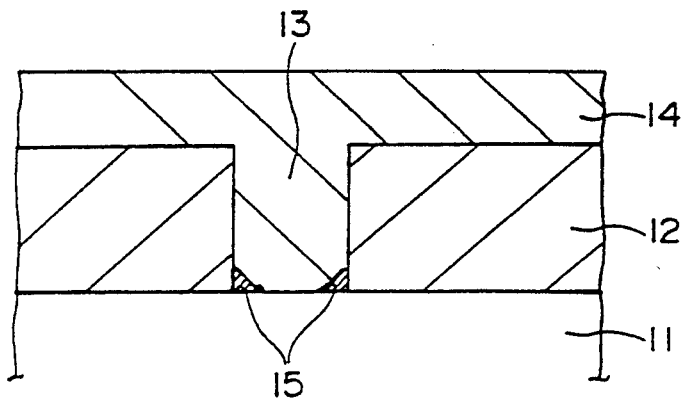
FIGS. 3-A and 3-B are cross-sectional views of a work in different steps of a semiconductor device fabricating process.
Figure 3B:
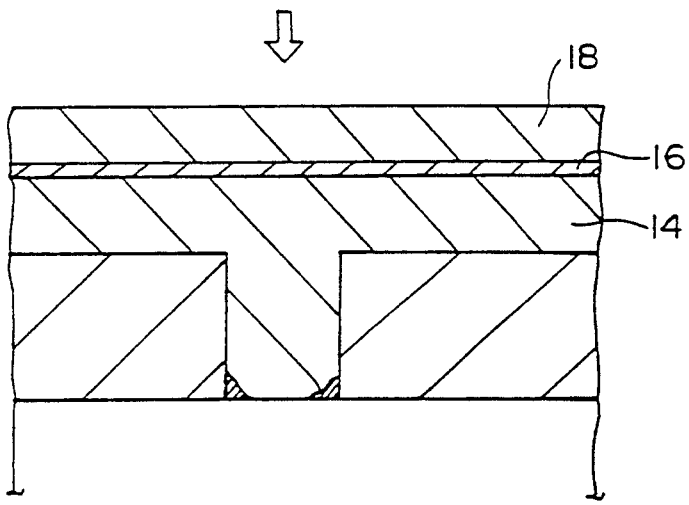
Figure 4:
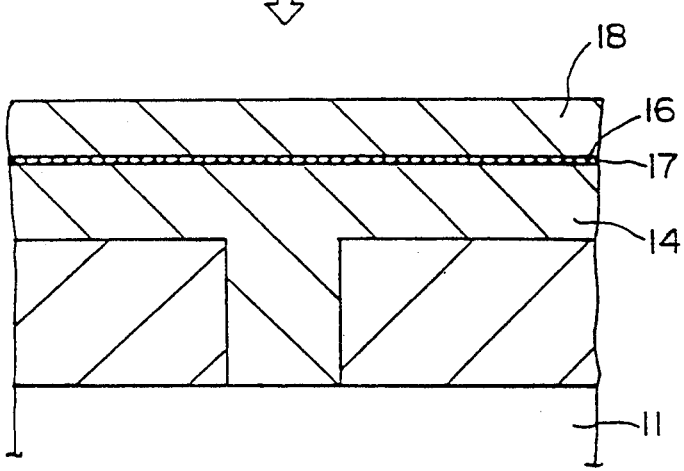
FIG. 4 is a cross-sectional view of the work shown in FIGS. 3-A and 3-B in a Ge particle removing process of a Ge particle removing method in a second embodiment according to the present invention.

Referring to FIGS. 3-A and 3-B, a layer of insulating film 12 provided with contact holes 13, an Al/Ge alloy film 14 of 500 nm in thickness, a Cu film 16 of 20 nm in thickness and an Al film 18 of 300 nm in thickness are formed sequentially in that order on a silicon substrate 11 to obtain a work as shown in FIG. 3-B.

Then, the work is heated at 300° C. for 30 min for annealing. Consequently, a Ge/Cu compound layer 17 is formed between the Al/Ge alloy layer 14 and the Al layer 18. Then, the wiring layer consisting of the Al/Ge alloy film 14, the Ge/Cu compound layer 17, the Cu film 16 and the Al film 18 is patterned in a wiring pattern. Since the Al/Ge alloy film 14 and the Al film 18 forming the wiring layer thus formed are separated by the Ge/Cu compound layer 17 formed therebetween, the perfect disconnection of the wiring lines does not occur even if either the Ge/Al alloy film 14 or the Al film 18 is broken due to electromigration or stress migration, which enhances the reliability of the wiring layer.

The Cu film 16 may be substituted by a film of any other metal capable of producing a compound together with Ge. Possible metals for forming a film instead of the Cu film 16 are Mg, Ti, V, Cr, Mn, Fe, Co, Ni, Zr, Nb, Mo, Pd, Te, Hf, Ta, Ir and Pt.

A barrier metal film may be formed between the BPSG film 12 and the Al/Ge alloy film 14.

As is apparent from the foregoing description, according to the present invention, Ge particles precipitated in the Al/Ge alloy film and the metal forming the metal film formed over the surface of the Al/Ge alloy film interact to form a compound when the work consisting of the substrate, the layer of insulating film, the Al/Ge alloy film and the metal film is subjected to a heat treatment, so that few Ge particles remain in the Al/Ge alloy film and hence the contact resistance of the Al/Ge alloy film is reduced. Since the precipitated Ge particles are removed, the electromigration resistance of the Al/Ge alloy film is not deteriorated by the precipitated Ge particles.

What is claimed is:

1. A method of removing germanium particles precipitated in an aluminum/germanium alloy film, comprising:
   a first process of forming a metal film of a metal capable of producing a compound together with germanium over the surface of an aluminum/germanium alloy film formed over the surface of a substrate; and
   a second process of subjecting the substrate carrying the aluminum/germanium alloy film and the metal film to heat treatment at 300° C. for 30 minutes so that germanium particles precipitated in the aluminum/germanium alloy film and the metal forming the metal film interact to produce a compound, thereby removing the germanium particles from the aluminum/germanium alloy film.

2. A method of removing germanium particles according to claim 1, wherein said metal film is a copper film.

3. A method of removing germanium particles according to claim 1, wherein a barrier metal film is formed under the aluminum/germanium alloy film.

4. A method according to claim 1, wherein the metal film is selected from a group consisting of Mg, Ti, V, Cr, Mn, Fe, Co, Ni, Zr, Nb, Mo, Pd, Te, Hf, Ta, Ir and Pt.

5. A method of removing germanium particles precipitated in an aluminum/germanium alloy film, comprising:
   forming a copper film over a surface of an aluminum/germanium alloy film formed over a surface of a substrate; and then
   subjecting the substrate carrying the aluminum/germanium alloy film and the copper film to a heat treatment so that germanium particles precipitated in the aluminum/germanium alloy film and the copper forming the copper film interact to produce a compound, thereby removing the germanium particles from the aluminum/germanium alloy film.

6. A method according to claim 5, wherein a barrier metal film is formed under the aluminum/germanium alloy film.

* * * * *